United States Patent
Kim et al.

(10) Patent No.: US 9,971,697 B2
(45) Date of Patent: May 15, 2018

(54) NONVOLATILE MEMORY MODULE HAVING DRAM USED AS CACHE, COMPUTING SYSTEM HAVING THE SAME, AND OPERATING METHOD THEREOF

(71) Applicant: Samsung Electronics Co., Ltd., Suwon-si (KR)

(72) Inventors: Chankyung Kim, Hwaseong-si (KR); Uksong Kang, Seongnam-si (KR); Sanguhn Cha, Yongin-si (KR); Sungyong Seo, Seongnam-si (KR); Youngjin Cho, Seoul (KR); Seongil O, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/354,354

(22) Filed: Nov. 17, 2016

(65) Prior Publication Data

US 2017/0168931 A1  Jun. 15, 2017

(30) Foreign Application Priority Data

Dec. 14, 2015  (KR) .................. 10-2015-0178365

(51) Int. Cl.

| | | |
|---|---|---|
| *G06F 12/08* | (2016.01) | |
| *G06F 12/0871* | (2016.01) | |
| *G11C 11/4093* | (2006.01) | |
| *G11C 7/10* | (2006.01) | |
| *G06F 12/0802* | (2016.01) | |
| *G06F 12/0853* | (2016.01) | |

(52) U.S. Cl.
CPC ...... *G06F 12/0871* (2013.01); *G06F 12/0802* (2013.01); *G06F 12/0853* (2013.01); *G11C 7/1072* (2013.01); *G11C 11/4093* (2013.01); *G06F 2212/22* (2013.01); *G06F 2212/60* (2013.01); *G06F 2212/601* (2013.01)

(58) Field of Classification Search
CPC ............ G11C 7/1072; G11C 11/40607; G11C 11/4092; G11C 11/4096; G11C 14/0018; G11C 16/0483; G11C 11/4093; G06F 12/0246; G06F 2212/72; G06F 2212/601; G06F 2212/60; G06F 2212/22; G06F 12/0871; G06F 12/0853; G06F 12/0802
See application file for complete search history.

(56) References Cited

U.S. PATENT DOCUMENTS 5,014,195 A * 5/1991 Farrell ................ G06F 12/0864
365/230.01
5,577,223 A 11/1996 Tanoi
(Continued)

*Primary Examiner* — Vanthu Nguyen
(74) *Attorney, Agent, or Firm* — Onello & Mello, LLP

(57) ABSTRACT

A nonvolatile memory module includes at least one nonvolatile memory, at least one nonvolatile memory controller configured to control the nonvolatile memory, at least one dynamic random access memory (DRAM) used as a cache of the at least one nonvolatile memory, data buffers configured to store data exchanged between the at least one DRAM and an external device, and a memory module control device configured to control the nonvolatile memory controller, the at least one DRAM, and the data buffers. The at least one DRAM stores a tag corresponding to cache data and compares the stored tag with input tag information to determine whether to output the cache data.

17 Claims, 18 Drawing Sheets

(56) References Cited

U.S. PATENT DOCUMENTS

| | | | | |
|---|---|---|---|---|
| 5,682,515 | A * | 10/1997 | Lau | G06F 12/0864 711/118 |
| 5,860,127 | A * | 1/1999 | Shimazaki | G06F 12/0864 711/E12.018 |
| 6,000,013 | A * | 12/1999 | Lau | G06F 12/0893 711/118 |
| 6,425,056 | B2 * | 7/2002 | Meyer | G06F 12/0864 365/49.1 |
| 6,463,506 | B1 | 10/2002 | McAllister et al. | |
| 6,912,628 | B2 | 6/2005 | Wicki et al. | |
| 7,051,166 | B2 | 5/2006 | Sharma | |
| 7,679,133 | B2 | 3/2010 | Son et al. | |
| 7,827,348 | B2 | 11/2010 | Lee et al. | |
| 8,082,482 | B2 | 12/2011 | Gower et al. | |
| 8,134,875 | B2 * | 3/2012 | Baxter | G11O 5/02 365/185.08 |
| 8,553,466 | B2 | 10/2013 | Han et al. | |
| 8,559,235 | B2 | 10/2013 | Yoon et al. | |
| 8,572,320 | B1 * | 10/2013 | Maheshwari | G06F 1/3275 711/119 |
| 8,607,121 | B2 | 12/2013 | Moyer | |
| 8,654,587 | B2 | 2/2014 | Yoon et al. | |
| 8,874,831 | B2 | 10/2014 | Lee et al. | |
| 8,935,481 | B2 | 1/2015 | Maybee et al. | |
| 9,043,552 | B2 | 5/2015 | Zhou et al. | |
| 9,361,250 | B2 * | 6/2016 | Shan | G06F 13/1694 |
| 9,460,791 | B1 * | 10/2016 | Shallal | G11O 5/04 |
| 2004/0103251 | A1 * | 5/2004 | Alsup | G06F 12/0897 711/122 |
| 2009/0313416 | A1 | 12/2009 | Nation | |
| 2011/0233648 | A1 | 9/2011 | Seol et al. | |
| 2012/0221785 | A1 | 8/2012 | Chung et al. | |
| 2013/0138892 | A1 | 5/2013 | Loh et al. | |
| 2013/0290607 | A1 | 10/2013 | Chang et al. | |
| 2013/0329491 | A1 * | 12/2013 | Chang | G11O 5/04 365/185.03 |
| 2014/0006696 | A1 | 1/2014 | Ramanujan et al. | |
| 2014/0229655 | A1 | 8/2014 | Goss et al. | |
| 2014/0365715 | A1 | 12/2014 | Lee | |
| 2015/0121137 | A1 | 4/2015 | McKnight et al. | |
| 2015/0255130 | A1 * | 9/2015 | Lee | G11C 14/0018 711/103 |
| 2015/0261446 | A1 * | 9/2015 | Lee | G06F 13/385 711/103 |
| 2016/0299719 | A1 * | 10/2016 | Liu | G06F 3/061 |

* cited by examiner

NONVOLATILE MEMORY MODULE HAVING DRAM USED AS CACHE, COMPUTING SYSTEM HAVING THE SAME, AND OPERATING METHOD THEREOF

CROSS-REFERENCE TO RELATED APPLICATION(S)

This U.S. non-provisional patent application claims priority under 35 U.S.C. § 119 to Korean Patent Application No. 10-2015-0178365 filed Dec. 14, 2015, the disclosure of which are hereby incorporated by reference in its entirety.

BACKGROUND

Embodiments of the inventive concepts relate to a nonvolatile memory module, a computing system having the same, and an operating method thereof.

A nonvolatile memory, which is compatible with various interfaces of existing computing systems, is being developed. For example, use of a flash memory as a data storage device or a working memory by mounting the flash memory on the same slot or channel as a main memory or working memory is being developed. In such an embodiment, compatibility with a conventionally used volatile random access memory (RAM), for example, a DRAM, is being considered.

SUMMARY

Embodiments of the inventive concepts provide a technique capable of providing optimum integrity of data and a low-power characteristic while maintaining the compatibility with the volatile RAM.

Embodiments of the inventive concepts provide a nonvolatile memory module, a computing system having the same, and an operating method thereof.

In one aspect, the embodiments of the inventive concepts are directed to a nonvolatile memory module, which includes at least one nonvolatile memory, at least one nonvolatile memory controller configured to control the at least one nonvolatile memory, at least one dynamic random access memory (DRAM) used as a cache of the at least one nonvolatile memory, data buffers configured to store data exchanged between the at least one DRAM and an external device, and a memory module control device configured to control the nonvolatile memory controller, the at least one DRAM, and the data buffers. The at least one DRAM stores a tag corresponding to cache data and compares the stored tag with input tag information to determine whether to output the cache data.

In another aspect, the embodiments of the inventive concepts are directed to a nonvolatile memory module, which includes at least one first nonvolatile memory, at least one second nonvolatile memory, a first nonvolatile memory controller configured to control the at least one first nonvolatile memory, a second nonvolatile memory controller configured to control the at least one second nonvolatile memory, first DRAMs connected to the first nonvolatile memory controller, second DRAMs connected to the second nonvolatile memory controller, data buffers connected to the first and second DRAMs, and a memory module control device configured to generate a first command/address and a second command/address in response to a command/address from an external device, control the first and second nonvolatile memory controllers using the first command/address, and control the first and second DRAMs using the second command/address. Each of the first and second DRAMs stores a cache and determines whether a cache hit is generated with respect to the cache.

In another aspect, the embodiments of the inventive concepts are directed to a computing system, which includes a processor, and at least one nonvolatile memory module connected to the processor based on a double data rate (DDR) interface. The nonvolatile memory module includes at least one nonvolatile memory, and at least one DRAM configured to perform a cache function of the at least one nonvolatile memory, store a tag of a cache, and determine whether a hit/miss is generated with respect to the cache, through tag comparison.

In another aspect, the embodiments of the inventive concepts are directed to an operating method of a nonvolatile memory module that comprises at least one cache DRAM and at least one nonvolatile memory. The method includes receiving a command/address from a processor, generating a DRAM command/address or nonvolatile memory command/address corresponding to the command/address, determining, at the at least one cache DRAM, whether a cache hit is generated, in response to the DRAM command/address, and when the determination result indicates that the cache hit is not generated, controlling the nonvolatile memory in response to the nonvolatile memory command/address.

In another aspect, the embodiments of the inventive concepts are directed to a nonvolatile memory module including at least one nonvolatile memory, at least one nonvolatile memory controller configured to control the at least one nonvolatile memory, at least one nonvolatile memory controller configured to control the at least one nonvolatile memory, at least one dynamic random access memory (DRAM) used as a cache of the at least one nonvolatile memory, and a memory module control device configured to control the nonvolatile memory controller and the at least one DRAM and configured to output tag information to the at least one DRAM. The at least one DRAM stores a tag corresponding to cache data and compares the stored tag with the tag information from the memory module control device to determine whether a hit/miss is generated with respect to the cache, through the tag comparison.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION

Figure 1:
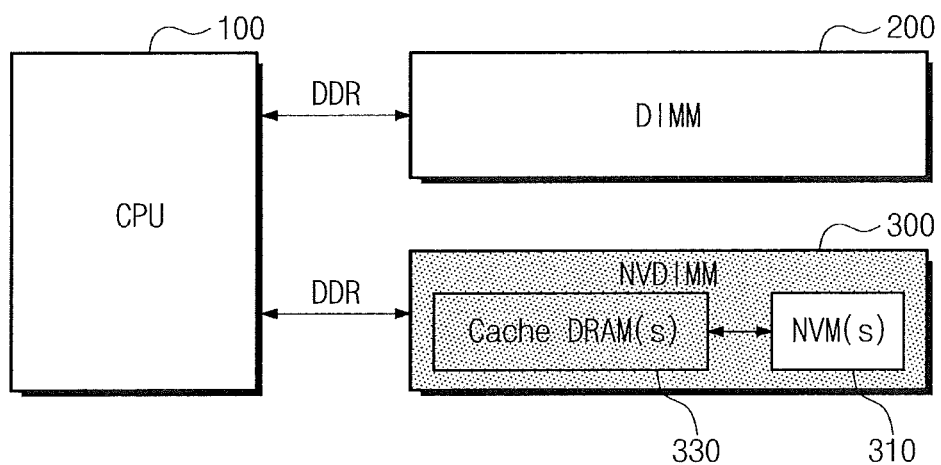
FIG. 1 is a block diagram illustrating a computing system according to some embodiments of the inventive concepts.

Reference will now be made in detail to the embodiments of the present general inventive concepts, examples of which are illustrated in the accompanying drawings, wherein the reference numerals refer to the like elements throughout. The embodiments are described below in order to explain the present general inventive concepts by referring to the figures.

FIG. 1 is a block diagram illustrating a computing system 10 according to some embodiments of the inventive concepts. Referring to FIG. 1, the computing system 10 may include a processor (CPU) 100, at least one memory module (DIMM) 200, and at least one nonvolatile memory module (NVDIMM) 300.

In some embodiments, the computing system 10 may include, for example, one of a plurality of devices such as a computer, a portable computer, an ultra-mobile personal computer (UMPC), a workstation, a data server, a net-book, a personal data assistant (PDA), a web tablet, a wireless phone, a mobile phone, a smart phone, an e-book, a portable multimedia player (PMP), a digital camera, a digital audio recorder/player, a digital picture/video recorder/player, a portable game machine, a navigation system, a black box, a 3D television, a device capable of transmitting and receiving information at a wireless circumstance, a wearable device, one of various electronics devices constituting a home network, one of various electronics devices constituting computer network, one of various electronics devices constituting telematics network, a radio-frequency identification (RFID), one of various electronic devices constituting a computing system, or the like.

The processor 100 may control an overall operation of the computing system 10. The processor 100 may be, for example, a central processing unit (CPU), a co-processor, an arithmetic processing unit (APU), a graphics processing unit (GPU), a digital signal processor (DSP), a memory controller herb (MCH), a platform controller hub (PCH), or the like. The processor 100 may process data by performing various operations of the computing system 10. Although not illustrated in FIG. 1, the processor 100 may further include a memory management unit (MMU) for managing the memory module 200 and the nonvolatile memory module 300.

The memory module 200 may be connected to the processor 100 through, for example, a double data rate (DDR) interface. In some embodiments, the DDR interface may comply with a memory standard specification of a joint electron device engineering council (JEDEC). The memory module 200 illustrated in FIG. 1 may be connected to the processor 100 according to the DDR interface. However, embodiments of the inventive concepts are not limited thereto. That is, the memory module 200 may be connected to the processor 100 through various kinds of communication interfaces other than the DDR interface. For example, a communication interface may be implemented with a communication interface, for example, a non-volatile memory express NVMe, a peripheral component interconnect express PCIe, a serial at attachment SATA, a small computer system interface SCSI, a serial attached SCSI SAS, a universal storage bus USB attached SCSI UAS, an internet small computer system interface iSCSI, a fiber Channel, a fiber channel over Ethernet FCoE, or the like.

The memory module 200 may be, for example, a dual in-line memory module (DIMM). The memory module 200 may include at least one dynamic random access memory (DRAM). The memory modules 200 may be used as a working memory of the processor 100.

The nonvolatile memory module 300 may be connected to the processor 100 through, for example, the DDR interface. The nonvolatile memory module 300 illustrated in FIG. 1 is connected to the processor 100 according to the DDR interface. However, embodiments of the inventive concept are not limited thereto. That is, the nonvolatile memory module 300 according to some embodiments of the inventive concepts may be connected to the processor 100 through various kinds of communication interfaces other than the DDR interface.

The nonvolatile memory module 300 may be, for example, the dual in-line memory module (DIMM). The nonvolatile memory modules 300 may be used as a working memory of the processor 100. The nonvolatile memory module 300 may include at least one nonvolatile memory (NVM(s)) 310 and at least one cache DRAM(s) 330 used as a cache of the at least one nonvolatile memory 310.

In some embodiments, the at least one nonvolatile memory 310 may be, for example, a NAND flash memory, a vertical NAND flash memory (VNAND), a NOR flash memory, a resistive random access memory (RRAM), a phase change memory (PRAM), a magneto-resistive random access memory (MRAM), a ferroelectric random access memory (FRAM), a spin transfer torque random access memory (STT-RAM), or the like.

Furthermore, the nonvolatile memory may have, for example, a three-dimensional array structure. In an embodiment of the inventive concept, a three dimensional (3D) memory array is provided. The 3D memory array is monolithically formed in one or more physical levels of arrays of memory cells having, for example, an active area disposed above a silicon substrate and circuitry associated with the operation of those memory cells. The associated circuitry may be above or within the substrate. That is, the circuit associated with the operation of the memory cells may be located in a substrate or on a substrate. The term "monolithic" means that layers of each level of the array are directly deposited on the layers of each underlying level of the array.

In some embodiments of the inventive concepts, the 3D memory array includes, for example, vertical NAND strings that are vertically oriented such that at least one of the memory cells is located over another memory cell. The at least one memory cell may include, for example, a charge trap layer. Each vertical NAND string may include at least one select transistor located over the memory cells. The at least one selection transistor may have the same structure as the memory cells, and be monolithically formed together with the memory cells.

The 3D memory array is formed of a plurality of levels and has word lines and/or bit lines shared among levels. The following patent documents, which are hereby incorporated by reference, describe suitable configurations for 3D memory arrays, in which the 3D memory array is configured as a plurality of levels, with word lines and/or bit lines shared between levels: U.S. Pat. No. 7,679,133; U.S. Pat. No. 8,553,466; U.S. Pat. No. 8,654,587; U.S. Pat. No. 8,559,235; and U.S. Patent Publication Number 2011/0233648. The nonvolatile memory according to some embodiments of the inventive concepts may be applicable to a charge trap flash (CTF) in which an insulating layer is used as a charge storage layer, as well as a flash memory device in which a conductive floating gate is used as a charge storage layer.

The at least one cache DRAM 330 may perform a cache function of the at least one nonvolatile memory 310. The at least one cache DRAM 330 may store a tag corresponding to cache data or generate a match signal indicating a cache hit or a cache miss through tag comparison.

The computing system 10 according to some embodiments of the inventive concepts may use the nonvolatile memory module 300 having the cache DRAM 330 as a working memory, thereby achieving a lower cost and higher capacity and performance than those of a conventional computing system.

Figure 2:
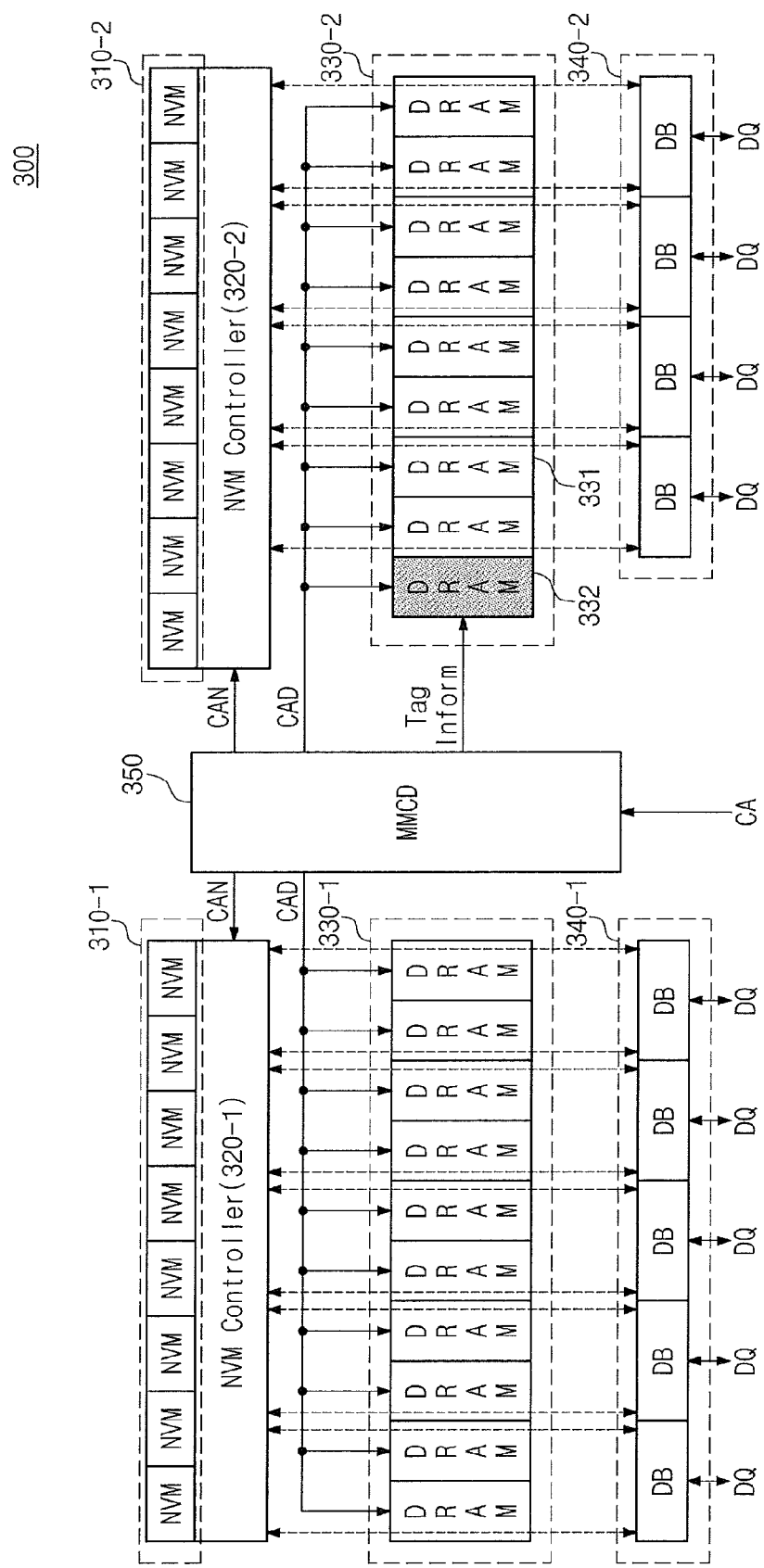
FIG. 2 is a block diagram illustrating a nonvolatile memory module according to some embodiments of the inventive concepts.

FIG. 2 is a block diagram illustrating the nonvolatile memory module 300 of FIG. 1 according to some embodiments of the inventive concepts. Referring to FIG. 2, the nonvolatile memory module 300 may include nonvolatile memories (NVMs) 310-1 and 310-2, nonvolatile memory controllers 320-1 and 320-2, DRAMs 330-1 and 330-2, data buffers (DBs) 340-1 and 340-2, and a memory module control device (MMCD) 350. In the nonvolatile memory module 300 illustrated in FIG. 2, the first and second nonvolatile memories 310-1 and 310-2, the first and second nonvolatile memory controllers 320-1 and 320-2, the first and second DRAMs 330-1 and 330-2, and the first and second data buffers 340-1 and 340-2 may be respectively arranged, for example, at left and right sides with respect to the memory module control device MMCD 350; however, the embodiments of the inventive concepts are not limited thereto. The first and second nonvolatile memories 310-1 and 310-2 may each include a plurality of nonvolatile memories (NVM). The first and second DRAMs 330-1 and 330-2 may each include a plurality of DRAMs. The first and second data buffers 340-1 and 340-2 may each include a plurality of data buffers. The first and second nonvolatile memory controllers 320-1 and 320-2 may be between the first and second nonvolatile memories 310-1 and 310-2 and the first and second DRAMs 330-1 and 330-2, respectively. The first and second DRAMs 330-1 and 330-2 may be between the first and second nonvolatile memory controllers 320-1 and 320-2 and the first and second data buffers 340-1 and 340-2, respectively.

The nonvolatile memory controllers 320-1 and 320-2 may control operations of the nonvolatile memories 310-1 and 310-2 based on a first command/address CAN, or a nonvolatile memory command/address. The first command/address CAN may be output from the memory module control device 350 to the first and second nonvolatile memory controllers 320-1 and 320-2. The number of the nonvolatile memories 310-1 and 310-2 illustrated in the nonvolatile memory module 300 of FIG. 2 are not limited thereto.

The DRAMs 330-1 and 330-2 may perform an input/output operation, for example, a write/read operation, based on a second command/address CAD, or a DRAM command/address. The second command/address CAD may be output from the memory module control device 350 to the first and second DRAMs 330-1 and 330-2. Each of the DRAMs 330-1 and 330-2 may include a dual port DRAM. For example, each of the DRAMs 330-1 and 330-2 may include first input/output ports and second input/output ports. The first input/output ports of the first and second DRAMs 330-1 and 330-2 may be connected to a data path between a DRAM 330-1/330-2 and the nonvolatile memory controller 320-1/320-2 corresponding thereto, and the second input/output ports of the first and second DRAMs 330-1 and 330-2 may be connected to a data path between the DRAM 330-1/330-2 and data buffers 340-1/340-2 corresponding thereto. In some embodiments, the first input/output ports may output 4 bytes (or 32 bits), and the second input/output ports may output 4 bytes (or 32 bits). Output data of the first and second input/output ports of the DRAMs 330-1 and 330-2 is not limited to the embodiments of FIG. 2 of the inventive concepts.

At least one DRAM 331 of the plurality of first DRAMs 330-1 and the plurality of second DRAMs 330-2 may store a tag corresponding to a cache line and compare stored tag information with input tag information. The remaining DRAMs may be implemented to store cache data corresponding to the tag. Hereinafter, a DRAM, which stores tags, may be referred to as "tag DRAM", and each of the remaining DRAMs may be referred to as "data DRAM". The at least one DRAM 331 may be a tag DRAM. DRAM 332 may be a data DRAM.

In some embodiments, the tag DRAM 331 may store a 4-byte tag. In some embodiments, the tag DRAM 331 may store tags in a 2-way, 1:8 direct mapping scheme. The tag may include location information about cache data stored in the data DRAMs and dirty/clear information indicating validity of cache data. In some embodiments, the tag may include an error correction value for error correction. Thus, the tag DRAM 331 may further include an error correction circuit for correcting an error. The memory module control device 350 may provide tag information to the DRAM 330-2.

The tag DRAM 331 may not be limited to the 2-way and 1:8 direct mapping scheme described herein. It should be understood that a way or mapping scheme of the tag DRAM 331 is determined according to various combinations.

In some embodiments, the tag DRAM and the data DRAM may include the same elements. In some embodiments, the tag DRAM and the data DRAM may include different elements. The number of the first and second DRAMs 330-1 and 330-2 illustrated in the nonvolatile memory module 300 of FIG. 2 are not limited thereto.

The first and second data buffers (DBs) 340-1 and 340-2 may be, respectively, connected to the first and second DRAMs 330-1 and 330-2 and may be configured to send data DQ provided from the processor 100, as illustrated in FIG. 1, to the first and second DRAMs 330-1 and 330-2, respectively, and send data DQ from the first and second DRAMs 330-1 and 330-2, respectively, to processor 100.

In some embodiments, the first and second data buffers 340-1 and 340-2 may be suitable for the DDR interface specifications. For example, each of the first and second data buffers 340-1 and 340-2 may input and output eight data signals and two data strobe signals. Although not illustrated in FIG. 2, each of the first and second data buffers 340-1 and 340-2 may output data, which is provided from the processor 100, to a DRAM corresponding thereto in response to a buffer command. In some embodiments, each of the data buffers 340-1 and 340-2 may include a first-in first-out (FIFO) or a dual port static random access memory (SRAM).

The memory module control device 350 may control an overall operation of the nonvolatile memory module (NVDIMM) 300. The memory module control device 350 may optimally control the first and second nonvolatile memory controllers 320-1 and 320-2, the first and second DRAMs 330-1 and 330-2, and the first and second data buffers 340-1 and 340-2 such that the nonvolatile memory module 300 is used as a working memory. The memory module control device 350 may receive a command/address CA from the processor 100, as seen in FIG. 1, to generate a first command/address CAN, that is, a nonvolatile memory command/address, or a second command/address CAD, that is, a DRAM command/address. The memory module control device 350 may generate and manage a tag corresponding to a cache line.

Figure 3:
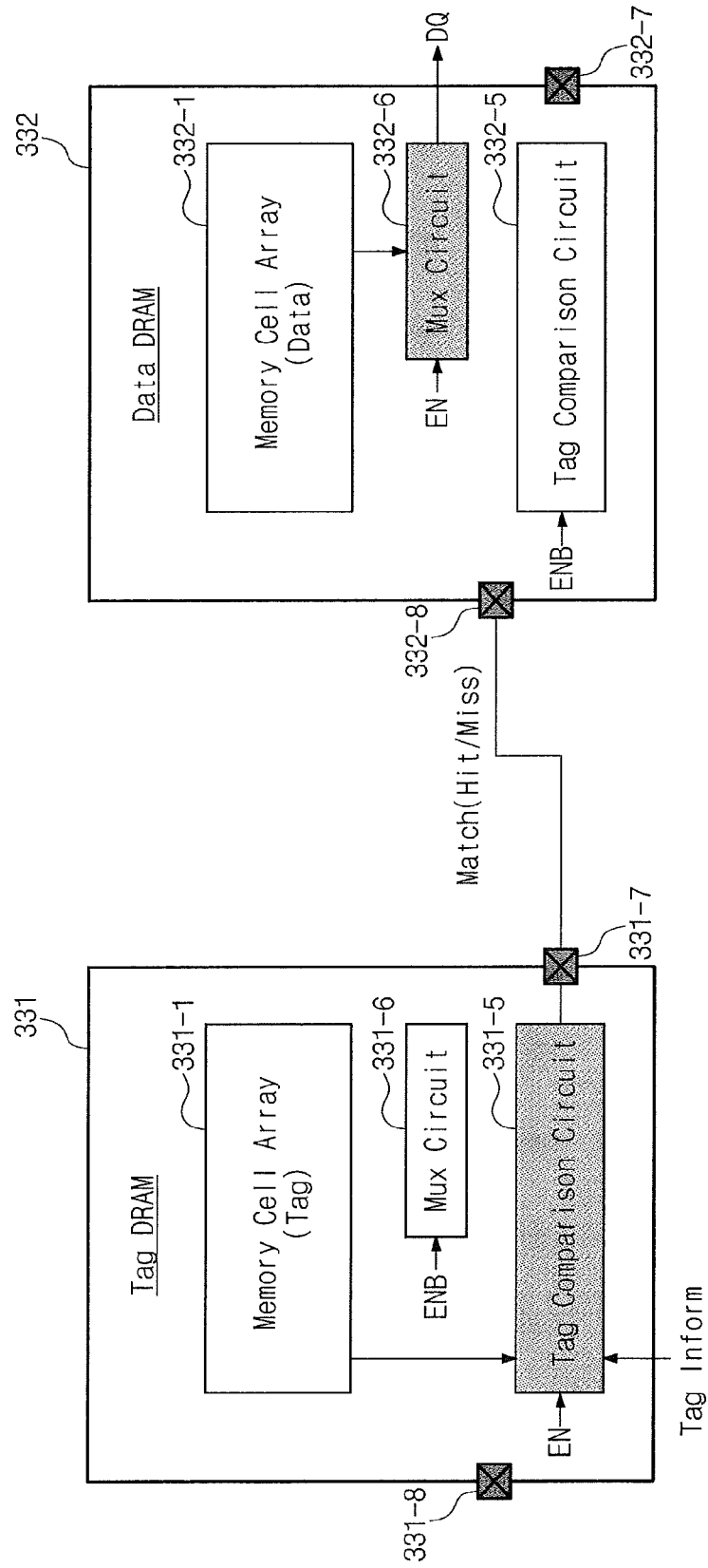
FIG. 3 is a block diagram illustrating a tag DRAM and a data DRAM, according to some embodiments of the inventive concepts.

FIG. 3 is a block diagram for conceptually illustrating the tag DRAM 331 and the data DRAM 332 of FIG. 2. Referring to FIG. 3, the tag DRAM 331 and the data DRAM 332 may include the same elements, for example, memory cell arrays 331-1 and 332-1, tag comparison circuits 331-5 and 332-5, and multiplexers (Mux Circuit) 331-6 and 332-6. In some embodiments, each of the tag DRAM 331 and the data DRAM 332 may include a dual port DRAM. The dual port DRAM may include input/output ports respectively corresponding to different kinds of devices, for example, data buffer/nonvolatile memory controller. A data path of the dual port DRAM may be connected to a first external device, for example, a data buffer, or a second external device, for example, a nonvolatile memory controller, based on the selection of the multiplexer, that is, multiplexers, 331-6 or 332-6.

The tag DRAM 331 may include the first memory cell array 331-1, the first tag comparison circuit 331-5, and the first multiplexer 331-6. The first memory cell array 331-1 may store a tag of a cache. In some embodiments, in a multi-way scheme, the first memory cell array 331-1 may store tags of a plurality of caches. The first memory cell array 331-1 may include a plurality of DRAM cells.

The first tag comparison circuit 331-5 may compare received tag information with a stored tag. The first tag comparison circuit 331-5 may receive the tag information from the memory module control device 350. In some embodiments, the first tag comparison circuit 331-5 may be activated according to a physical method, for example, fuse cutting or e-fuse, when the memory module 300 is manufactured. In some embodiments, the first tag comparison circuit 331-5 may be activated through a mode register set (MRS) setting. For convenience of description, FIG. 3 illustrates an embodiment in which the tag comparison circuit 331-5 is activated in response to an active signal EN corresponding to the MRS setting.

In some embodiments, an output value, that is, a match signal Match, of the first tag comparison circuit 331-5 may be output to an external device through at least one pin 331-7.

The first multiplexer 331-6 may be deactivated according to the fuse cutting or the MRS setting. For example, the first multiplexer 331-6 may be deactivated when the first tag comparison circuit 331-5 is activated. For convenience of description, FIG. 3 illustrates an embodiment in which the multiplexer 331-6 is deactivated in response to a deactivation signal ENB corresponding to the MRS setting. In some embodiments, the tag DRAM 331 may include at least one pin 331-8 associated with an input of the multiplexer 331-6.

In some embodiments, the tag DRAM 331 may further include an error correction circuit for correcting an error of a tag.

The data DRAM 332 may include the second memory cell array 332-1, the second tag comparison circuit 332-5, and the second multiplexer 332-6. The second memory cell array 332-1 may store cache data corresponding to a tag. In some embodiments, in a multi-way scheme, the second memory cell array 332-1 may store cache data corresponding to a plurality of caches.

The second tag comparison circuit 332-5 may be deactivated according to the fuse cutting or the MRS setting. For example, the second tag comparison circuit 332-5 may be deactivated when the second multiplexer 332-6 is activated. For convenience of description, FIG. 3 illustrates an embodiment in which the second tag comparison circuit 332-5 is deactivated in response to the deactivation signal ENB corresponding to the MRS setting. In some embodiments, the data DRAM 332 may include at least one pin 332-7 associated with an output of the second tag comparison circuit 332-5.

The second multiplexer 332-6 may be activated according to the fuse cutting or the MRS setting. For convenience of description, FIG. 3 illustrates an embodiment in which the second multiplexer 332-6 is deactivated in response to the activation signal EN corresponding to the MRS setting.

In some embodiments, the second multiplexer 332-6 may receive a tag comparison result value, that is, a match signal Match, through at least one pin 332-8 from the pin 331-7 of the tag DRAM 331. If the tag comparison result value Match indicates a cache hit, the second multiplexer 332-6 may output data DQ associated with a cache line to the processor 100, illustrated in FIG. 1. The cache data DQ provided to the processor 100 may include a value indicating that data is valid. If the tag comparison result value Match indicates a cache miss, the second multiplexer 332-6 may not output data associated with a cache operation to the processor 100. In such an embodiment, the data DRAM 332 may perform a flush operation with respect to data of the cache line and may try to change the cache line. That is, the second multiplexer 332-6 may be implemented to select one of a corresponding data buffer DB 340-1/340-2 and a corresponding nonvolatile memory controller NVM controller 320-1/320-2 as a data path in response to the tag comparison result value Match.

The tag DRAM 331 and the data DRAM 332 according to some embodiments of the inventive concepts may include the same elements, however, operations of the elements in the tag DRAM 331 may be complementary to those of the elements in the data DRAM 332.

In the embodiments of FIGS. 2 and 3 a tag is stored in one, for example, tag DRAM 331, of the first and second DRAMs 330-1 and 330-2. However, the embodiments of the present inventive concepts are not limited thereto. The nonvolatile memory module according to some embodiments of the inventive concepts may include a tag array storing a tag in each DRAM.

Figure 4:
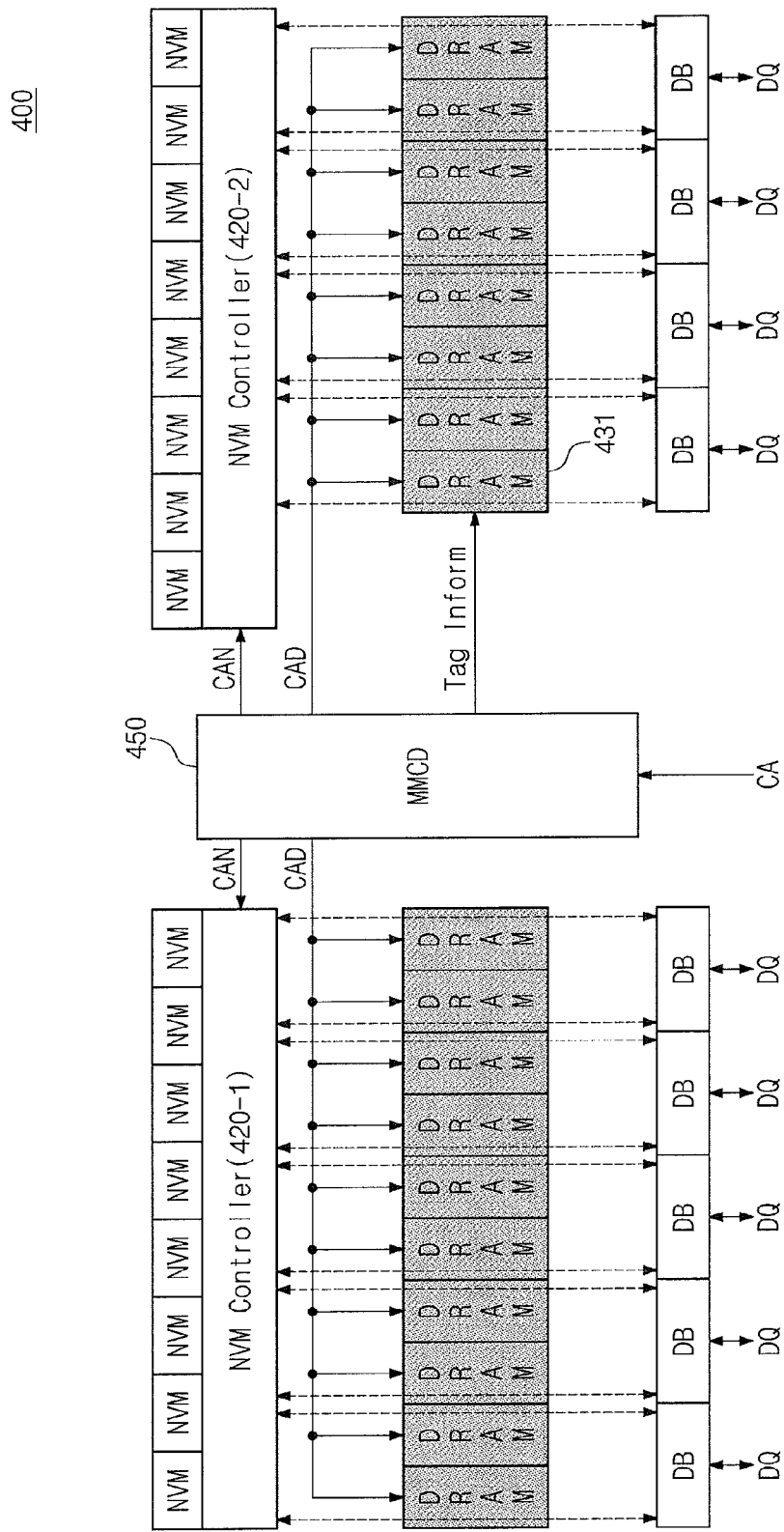
FIG. 4 is a diagram illustrating a nonvolatile memory module according to some embodiments of the inventive concepts.

FIG. 4 is a block diagram illustrating a nonvolatile memory module 400 according to some embodiments of the inventive concepts. Referring to FIG. 4, the nonvolatile memory module 400 may include a plurality of NVMs, first and second nonvolatile memory controllers 420-1 and 420-2, a plurality of DRAMs, and a plurality of data buffers DBs.

The nonvolatile memory module 400 may include the elements of nonvolatile memory module 300 of FIG. 1 except each of the DRAMs may include a tag array storing tags and a data array storing cache data corresponding to each tag. Each DRAM may perform tag comparison and may determine a data path for a data output of a cache line in response to a tag comparison result Match. The DRAMS include at least one DRAM 431.

Figure 5:
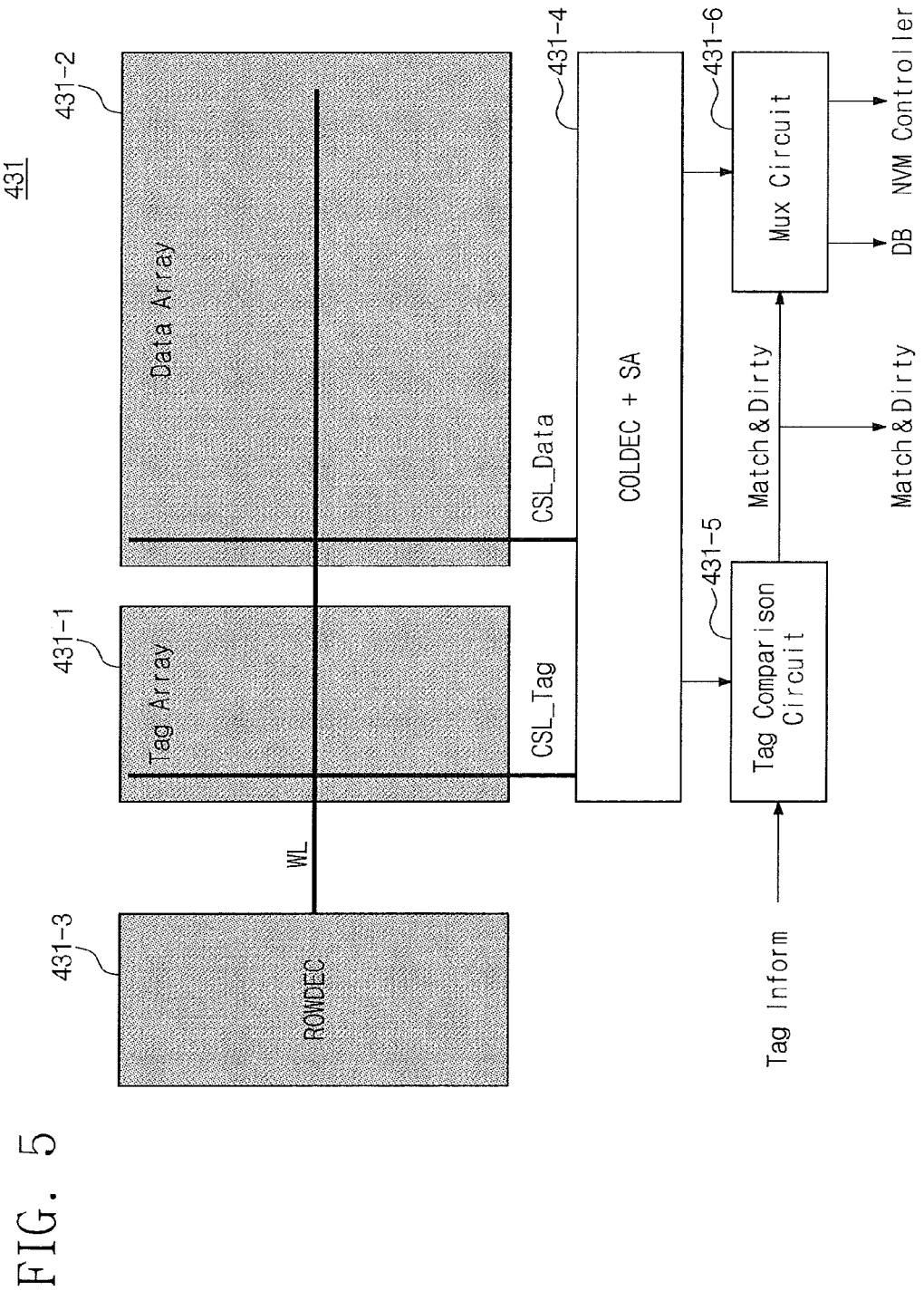
FIG. 5 is a block diagram illustrating one of DRAMs illustrated in FIG. 4.

FIG. 5 is a block diagram illustrating one of the DRAMs 431 illustrated in FIG. 4. Referring to FIG. 5, the DRAM 431 may include a tag array 431-1, a data array 431-2, a row decoder (ROWDEC) 431-3, a column decoder and sense amplifier (COLDEC+SA) 431-4, a tag comparison circuit 431-5, and a multiplexer (Mux Circuit) 431-6.

The row decoder 431-3 may activate a word line WL in response to a row address. A plurality of DRAM cells may be connected to the word line WL. The DRAM cells connected to the word line WL may include first DRAM cells included in the tag array 431-1 and second DRAM cells included in the data array 431-2.

The column decoder and sense amplifier 43143 may read DRAM cells corresponding to the word line WL and a column selection line or write data in DRAM cells. The column decoder and sense amplifier 431-4 may activate a first column selection line CSL_Tag corresponding to the tag array 431-1 and a second column selection line CSL_Data corresponding to the data array 431-2 in response to a column address. For example, the column decoder and sense amplifier 431-4 may activate the first column selection line CSL_Tag connected to the first DRAM cells of the tag array 431-1 and the second column selection line CSL_Data connected to the second DRAM cells of the data array 431-2 in response to the column address and may read a tag from the first DRAM cell of the tag array 431-1 or cache data corresponding to the tag from the second DRAM cells of the data array 431-2.

In some embodiments, the first column selection lines CSL_Tag and the second column selection line CSL_Data may be simultaneously activated in response to the column address. That is, the DRAM 431 according to some embodiments of the inventive concepts may activate two column selection lines CSL_Tag and CSL_Data in a bank.

The tag comparison circuit 431-5 may compare a tag stored in the tag array 431-1 with received tag information and output the comparison result Match & Dirty. A tag stored in the tag array 431-1 may include at least one bit indicating whether the data is dirty.

The multiplexer 431-6 may connect a data path to a data buffer DB, that is data buffer 340-1/340-2 or a nonvolatile memory (NVM) controller, that is, nonvolatile memory controller 320-1/320-2 in response to an output value of the tag comparison circuit 431-5.

Figure 6:
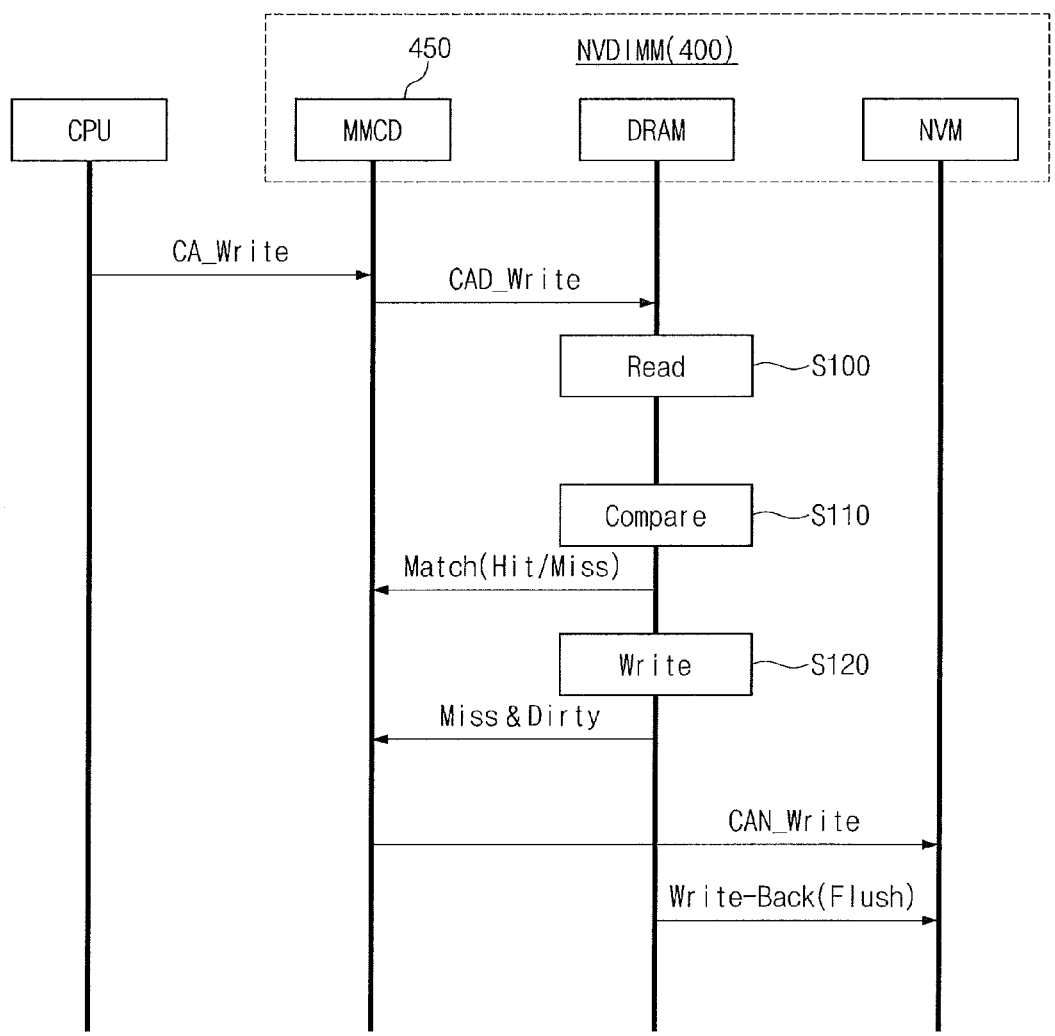
FIG. 6 is a diagram illustrating a write operation of a nonvolatile memory module illustrated in FIG. 4.

FIG. 6 is a diagram illustrating a write operation of the nonvolatile memory module (NVDIMM) 400 illustrated in FIG. 4. If a write request CA_Write is received by the memory module control device 450 from the processor (CPU) 100, the memory module control device MMCD 450 may generate a DRAM-dedicated write request CAD_Write, or a DRAM command/address, and may send it to a DRAM together with tag information. The DRAM may receive the tag information and the write request CAD_Write and may obtain a tag from an address corresponding to the write request CAD_Write. That is, the DRAM may read a tag from the address corresponding to the write request CAD_Write in step S100. Afterwards, the DRAM may compare the read tag with the received tag information, in step S110, to output a tag comparison result value Match, which indicates a cache hit or a cache miss. If the tag comparison result value Match indicates a cache hit, there may be no need to perform a write request. If the tag comparison result value Match indicates a cache miss, data may be written at a cache line corresponding to an address of the write request, in step S120. Afterwards, a dirty value may be added to the tag of the cache line of the DRAM. The cache miss and dirty value Miss & Dirty of the DRAM may be output to the memory module control device MMCD 450. Afterwards, the memory module control device MMCD 450 may send the write request CAN Write to the nonvolatile memory NVM so as to perform a flush operation, and data of a cache line stored in the DRAM may be written back (or flushed) Write-Back (Flush) to the nonvolatile memory NVM.

Figure 7:
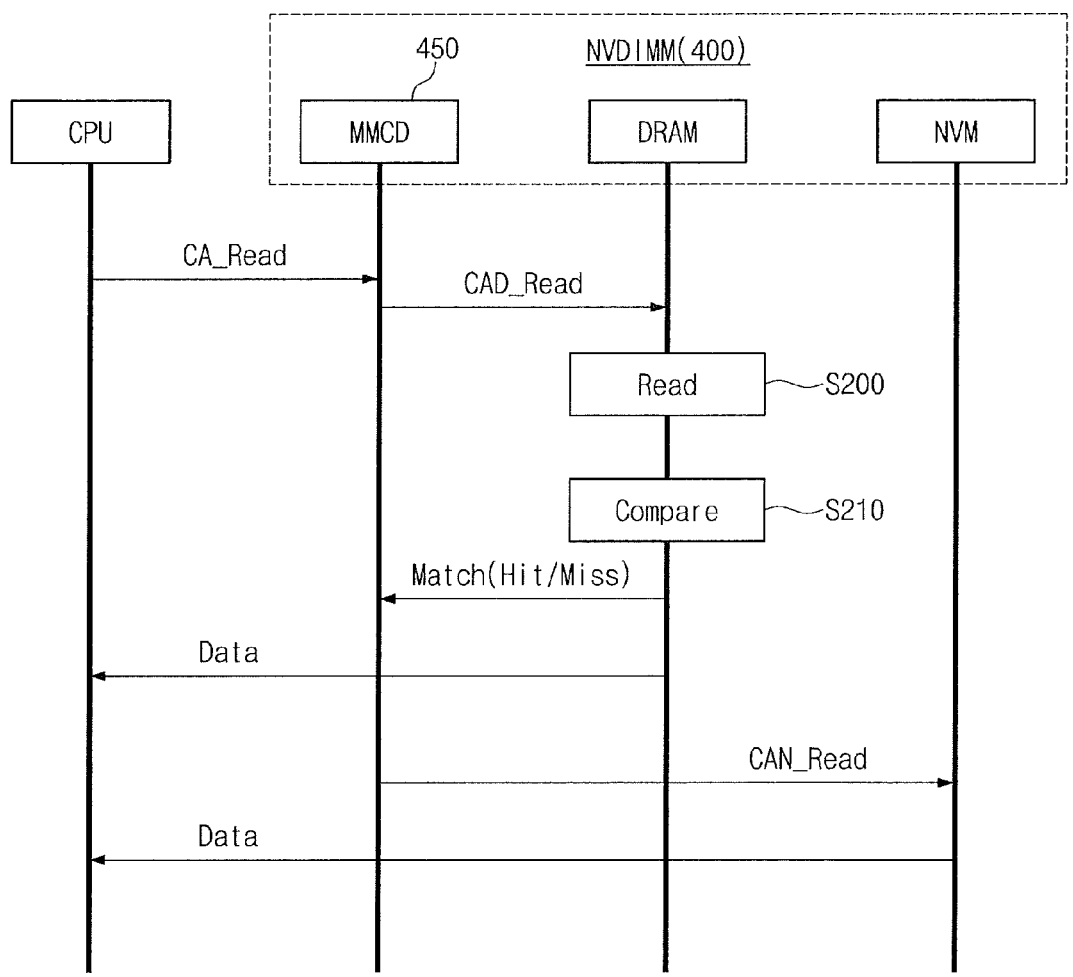
FIG. 7 is a diagram illustrating a read operation of a nonvolatile memory module of FIG. 4.

FIG. 7 is a diagram illustrating a read operation of the nonvolatile memory module (NVDIMM) 400 of FIG. 4. If a read request CA_Read is received by the memory module control device MMCD 450 from the processor (CPU) 100, the memory module control device MMCD 450 may generate a DRAM-dedicated read request CAD_Read and may send it to a DRAM together with tag information. The DRAM may receive the tag information and the read request CAD_Read and may obtain a tag from an address corresponding to the read request CAD_Read. That is, the DRAM may read a tag from the address corresponding to the request CAN_Read in step S200. Afterwards, the DRAM may compare the read tag with the received tag information, in step S210, to output a tag comparison result value Match which indicates a cache hit or a cache miss. If the tag comparison result value Match indicates a cache hit, data of a cache line of the DRAM may be output from the DRAM to the processor 100. If the tag comparison result value Match indicates a cache miss, the memory module control device MMCD 450 may generate a nonvolatile memory dedicated read request CAN_Read and may send the nonvolatile memory dedicated read request CAN_Read to the nonvolatile memory NVM. Afterwards, the nonvolatile memory NVM may read data corresponding to the read request CAN_Read and may transmit the read data to the processor 100 through the DRAM. Then, the data may be stored in a cache line of the DRAM.

The nonvolatile memory module 400 according to some embodiments of the inventive concepts may perform a multi cache way operation.

Figure 8:
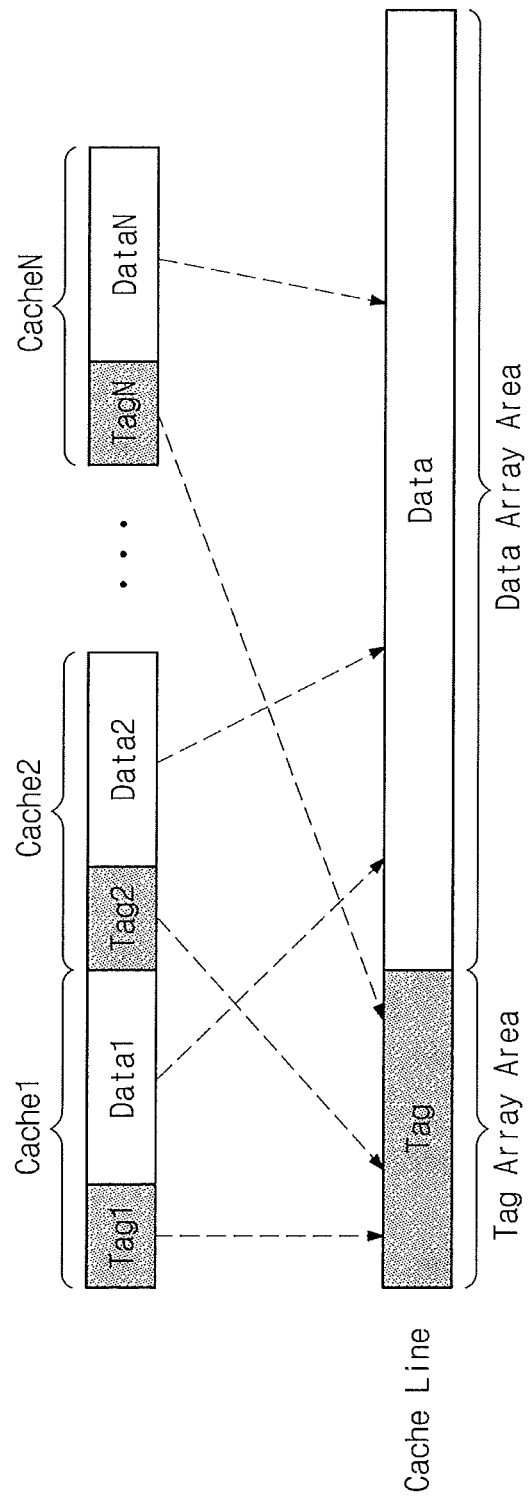
FIG. 8 is a diagram illustrating a configuration of a cache line supporting a multi cache way operation, according to some embodiments of the inventive concepts.

FIG. 8 is a diagram illustrating a configuration of a cache line supporting a multi cache way operation, according to some embodiments of the inventive concepts. Referring to FIG. 8, a cache line may be classified into a tag array area Tag, which stores tags Tag1 to TagN (N being an integer of 2 or more) respectively corresponding to a plurality of caches Cache1 to CacheN, and a data array area Data which stores pieces of data Data1 to DataN respectively corresponding to the caches Cache1 to CacheN. Here, the tags may mean location information (or addresses) of the data Data1 to DataN, respectively.

The tag according to some embodiments of the inventive concepts may correspond to the location information in a direct mapping method, a fully associative method, or a set associative method.

The cache according to some embodiments of the inventive concepts may further include parity.

Figure 9A:
FIGS. 9A and 9B are diagrams illustrating a cache configuration having parity, according to some embodiments of the inventive concepts.
Figure 9B:
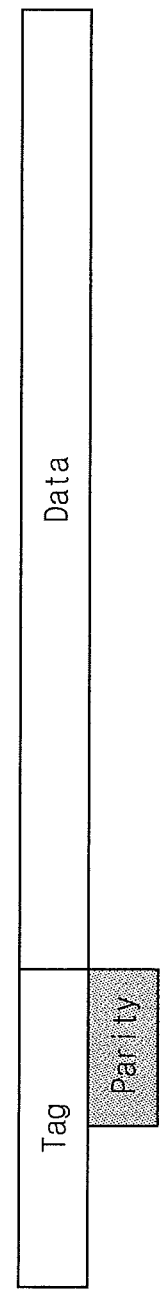

FIGS. 9A and 9B are diagrams illustrating a cache configuration having parity Parity, according to some embodiments of the inventive concepts. Referring to FIG. 9A, the cache may be composed of a tag, cache data, and parity for error correction of the tag. Referring to FIG. 9B, the cache may be composed of a tag and cache data, and the tag may include parity.

Figure 10:
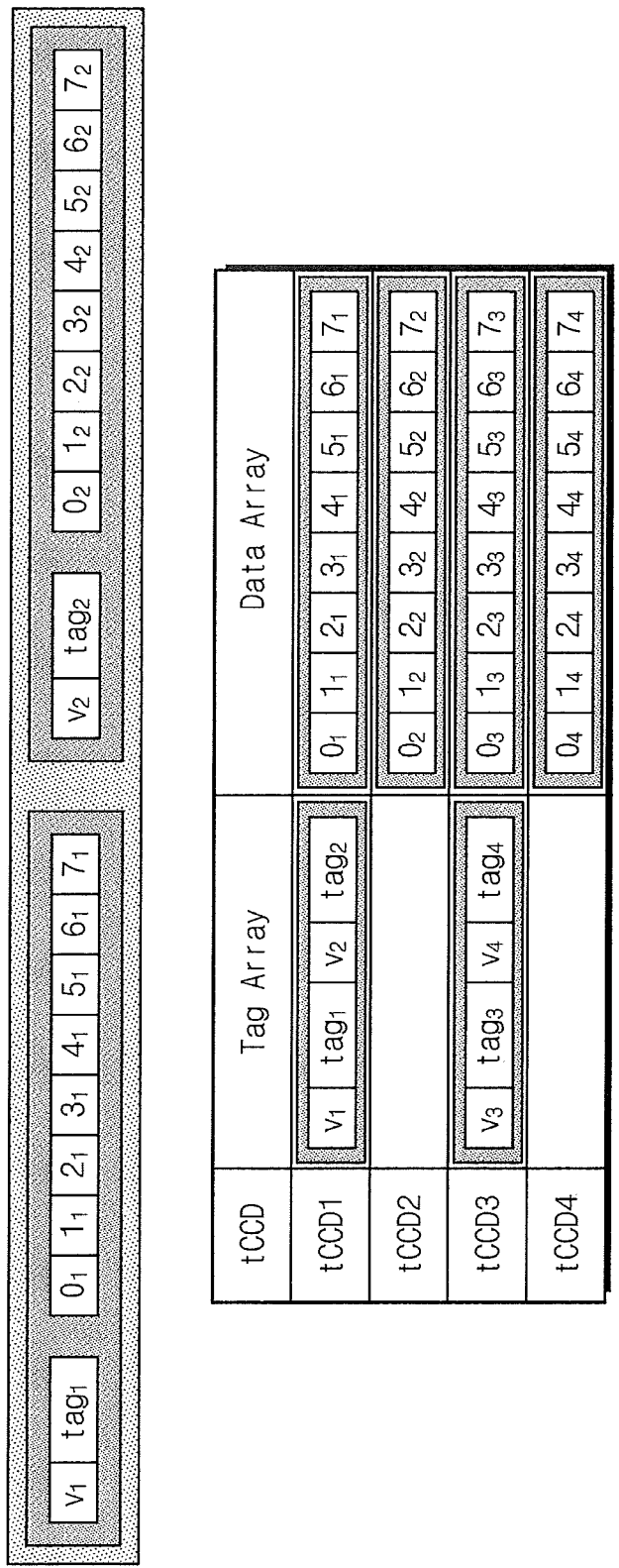
FIG. 10 is a diagram illustrating a method for outputting a cache based on a 2-way set associative method of a cache DRAM, according to some embodiments of the inventive concepts.

FIG. 10 is a diagram illustrating a method of outputting a cache based on a 2-way set associative method of a cache DRAM, according to some embodiments of the inventive concepts. Referring to FIG. 10, two sets of caches each composed of {Tag, Data} may be necessary for 2-way set associative cache. For descriptive convenience, it is assumed that 8-bit data is output to a column selection line CSL, a tag has the size of 4 bits, and data has the size of 8 bits; however, the present inventive concepts are not limited thereto. As a tag column selection line CSL_Tag and a first column selection line CSL_1 are simultaneously activated, two sets of tags, for example, $tag_1$ and $tag_2$, may be output from a tag array area Tag, and a set of data $\{0_1, 1_1, 2_1, 3_1, 4_1, 5_1, 6_1, 7_1\}$ may be output from a data array area Data after a column to column delay time tCCD1. The output tags from the tag array Tag may include dirty/clear information $v_1$ and $v_2$, respectively, as well as tag information $tag_1$ and $tag_2$. When a second column selection line CSL_2 is activated after a delay time, for example, a column to column delay time tCCD2, the remaining set of data $\{0_2, 1_2, 2_2, 3_2, 4_2, 5_2, 6_2, 7_2\}$ may be output to a data array area. After column to column delay time tCCD3 two sets of tags, for example $tag_3$ and $tag_4$ may be output from a tag array area Tag, and a set of data $\{0_3, 1_3, 2_3, 3_3, 4_3, 5_3, 6_3, 7_3\}$ may be output from a data array area Data after a column to column delay time tCCD3. The output tags from the tag array Tag may include dirty/clear information $v_3$ and $v_4$, respectively, as well as tag information $tag_3$ and $tag_4$. When a second column selection line CSL_2 is activated after a delay time, for example, a column to column delay time tCCD4, the remaining set of data $\{0_4, 1_4, 2_4, 3_4, 4_4, 5_4, 6_4, 7_4\}$ may be output to a data array area.

Meanwhile, it should be understood that a cache output method illustrated in FIG. 10 does not limit the embodiments of the inventive concepts. The N-way set associative cache may be output in various methods.

The nonvolatile memory module NVDIMM according to some embodiments of the inventive concepts may be implemented with a solid state drive (SSD).

Figure 11:
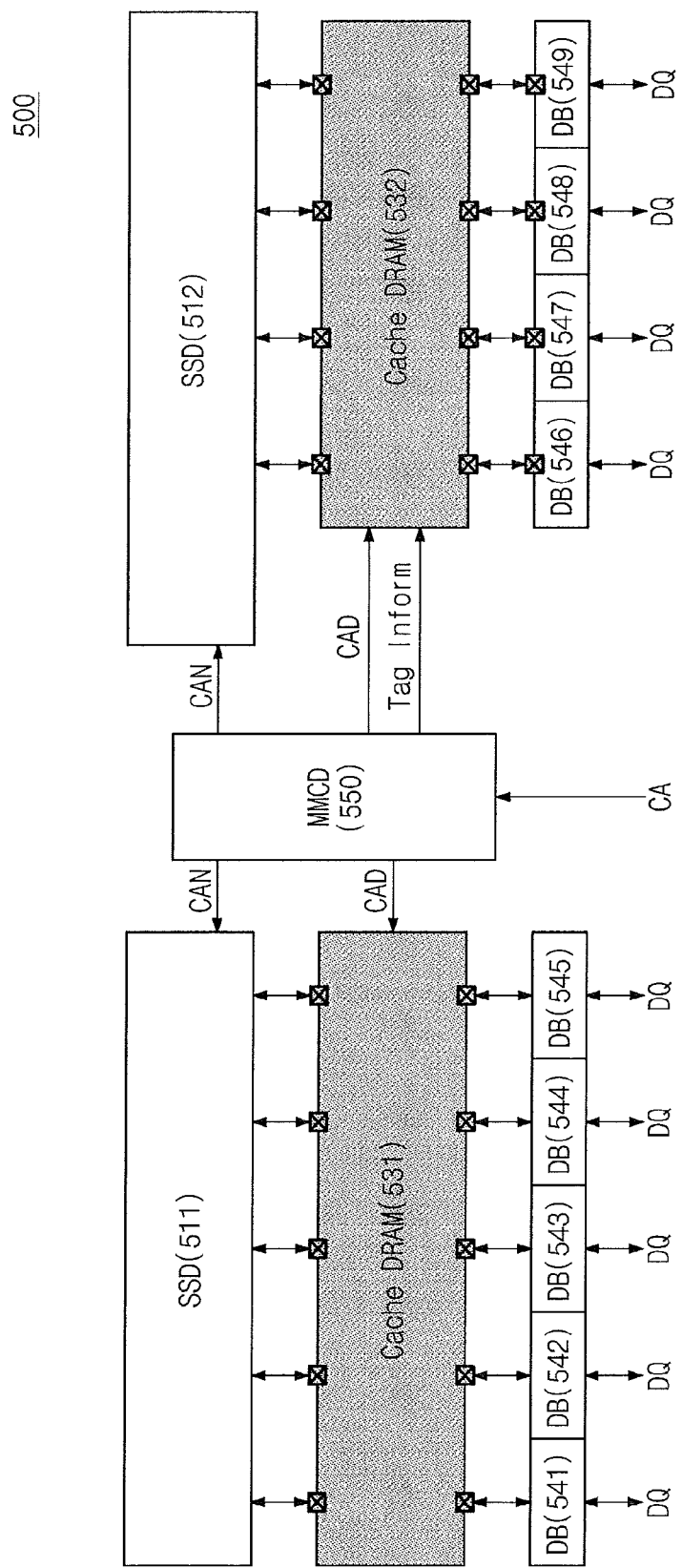
FIG. 11 is a block diagram illustrating a nonvolatile memory module according to some embodiments of the inventive concepts.

FIG. 11 is a block diagram illustrating a nonvolatile memory module 500 according to some embodiments of the inventive concepts. Referring to FIG. 11, the nonvolatile memory module 500 may include first and second solid state drives SSDs 511 and 512, first and second cache DRAMs 531 and 532, data buffers 541 to 549, and a memory module control device MMCD 550.

Each of the first and second solid state drives SSDs 511 and 512 may include nonvolatile memories to store massive data. Each of the first and second cache DRAMs 531 and 532 may be implemented to perform a cache function of each of the first and second solid state drives SSDs 511 and 512. Each of the first and second cache DRAMs 531 and 532 may be implemented with a dual port. Two cache DRAMs 531 and 532 are illustrated in FIG. 11; however, the embodiments of the present inventive concepts are not limited thereto.

The solid state drives SSDs 511 and 512 may receive the first command/address CAN from the memory module control device 550. The cache DRAMs 531 and 532 may receive the second command/address CAD from the memory module control device 550. First input/output ports of cache DRAMs 531 and 532 may be connected to a data path between the cache DRAMs 531 and 532 and the solid state drives SSDs 511 and 512. The second input/output ports of cache DRAMs 531 and 532 may be connected to a data path between the cache DRAM 531 and 532 and the data buffers 541 to 549. The memory module control device 550 may provide tag information to the cache DRAM 532. The data buffers (DBs) 541 to 549 may be, respectively, connected to the cache DRAMs 531 and 532 and may be configured to send data DQ provided from the processor 100, as illustrated in FIG. 1, to the cache DRAMs 531 and 532, respectively, and send data DQ from the cache DRAMs 531 and 532, respectively, to processor 100. The memory module control device 550 may receive a command/address CA from the processor 100, as seen in FIG. 1.

The nonvolatile memory module NVDIMM according to some embodiments of the inventive concepts may be implemented with a tiered memory to reduce routing.

Figure 12:
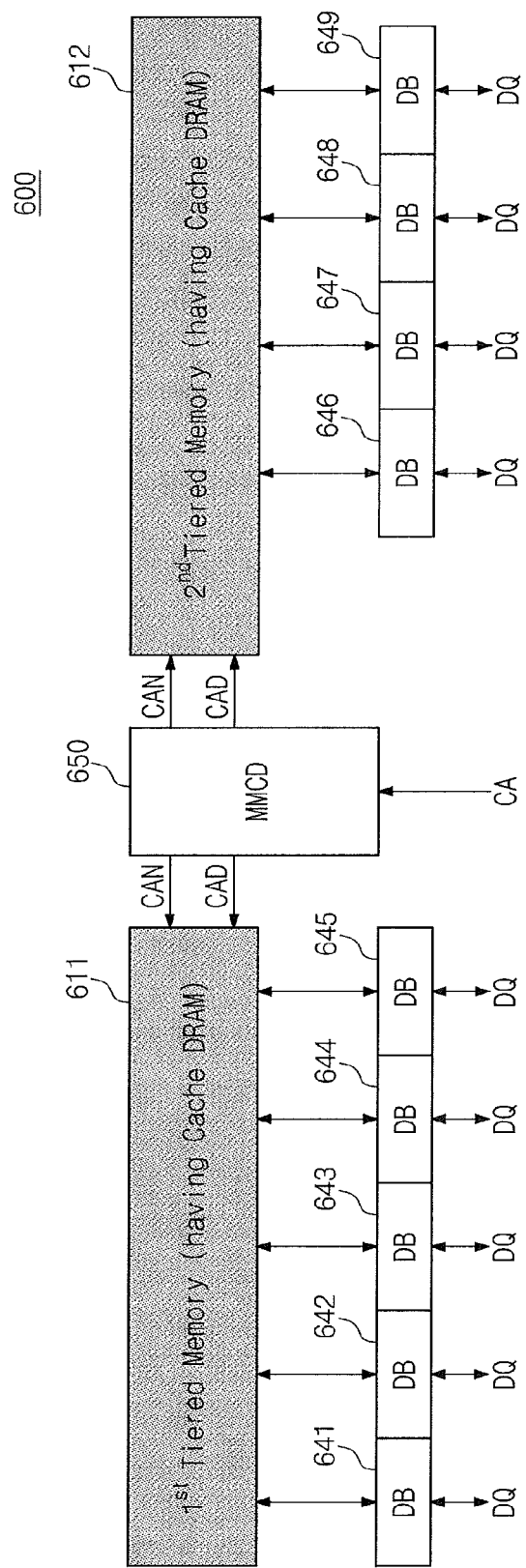
FIG. 12 is a block diagram illustrating a nonvolatile memory module according to some embodiments of the inventive concepts.

FIG. 12 is a block diagram illustrating a nonvolatile memory module 600 according to some embodiments of the inventive concepts. Referring to FIG. 12, the nonvolatile memory module 600 may include first and second tiered memories 611 and 612 having cache DRAM, data buffers 641 to 649, and a memory module control device 650.

Each of the first and second tiered memories 611 and 612 may include heterogeneous memories including at least one nonvolatile memory and at least one cache DRAM used as at least one cache.

The number of tiered memories 611 and 612 may be 2, as illustrated in FIG. 12; however, the embodiments of the present inventive concepts are not limited thereto.

The first and second tiered memories 611 and 612 may receive the first and second command/addresses CAN and CAD from the memory module control device 650. The first and second tiered memories 611 and 612 may be connected to the data buffers 641 to 649, respectively. The data buffers (DBs) 641 to 649 may be, respectively, connected to the first and second tiered memories 611 and 612 and may be configured to send data DQ provided from the processor 100, as illustrated in FIG. 1, to the first and second tiered memories 611 and 612, respectively, and send data DQ from the first and second tiered memories 611 and 612, respectively, to processor 100. The memory module control device 650 may receive a command/address CA from the processor 100, as seen in FIG. 1.

Figure 13:
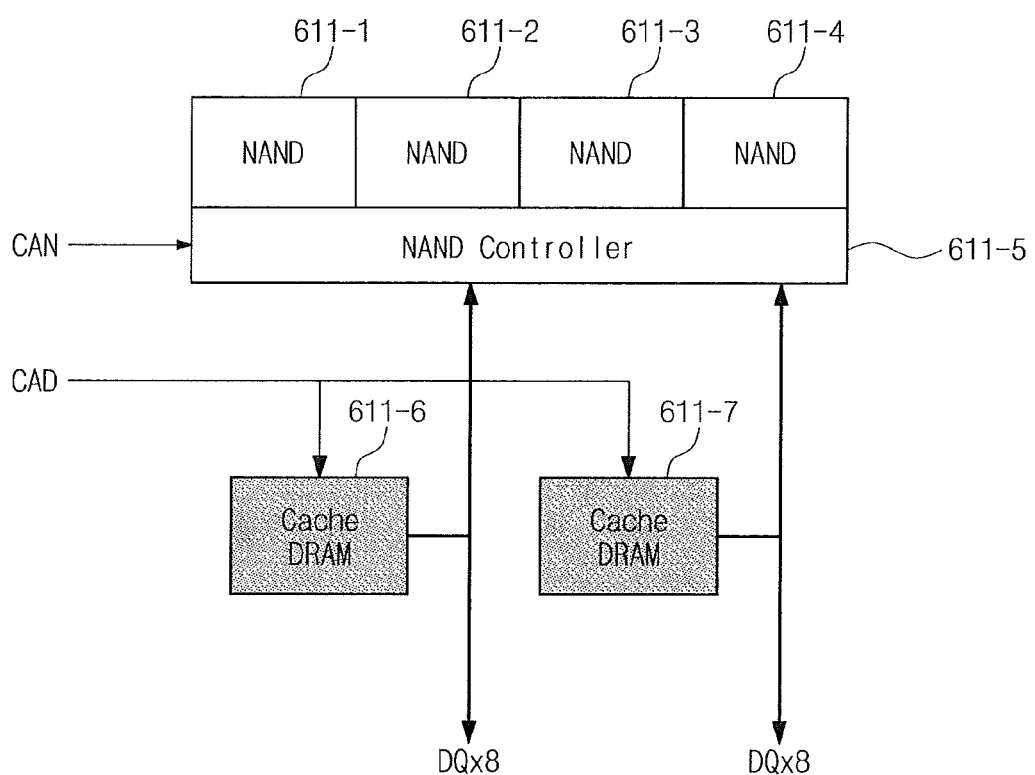
FIG. 13 is a block diagram illustrating a tiered memory according to some embodiments of the inventive concepts.

FIG. 13 is a block diagram illustrating the tiered memory 611 according to some embodiments of the inventive concepts. Referring to FIG. 13, the tiered memory 611 may include a plurality of NAND flash memories 611-1 to 611-4, a NAND flash memory controller 611-5, and cache DRAMs 611-6 and 611-7.

The NAND flash memory controller 611-5 and the cache DRAMs 611-6 and 611-7 may share input/output lines DQx8. Although not illustrated in FIG. 13, flush dedicated channels may be provided between the NAND flash memory controller 611-5 and the cache DRAMs 611-6 and 611-7. The NAND controller 611-5 receives the first command/ address CAN from the memory module control device 650. The cache DRAMs 611-6 and 611-7 receive the second command/address CAD from the memory module control device 650.

Figure 14:
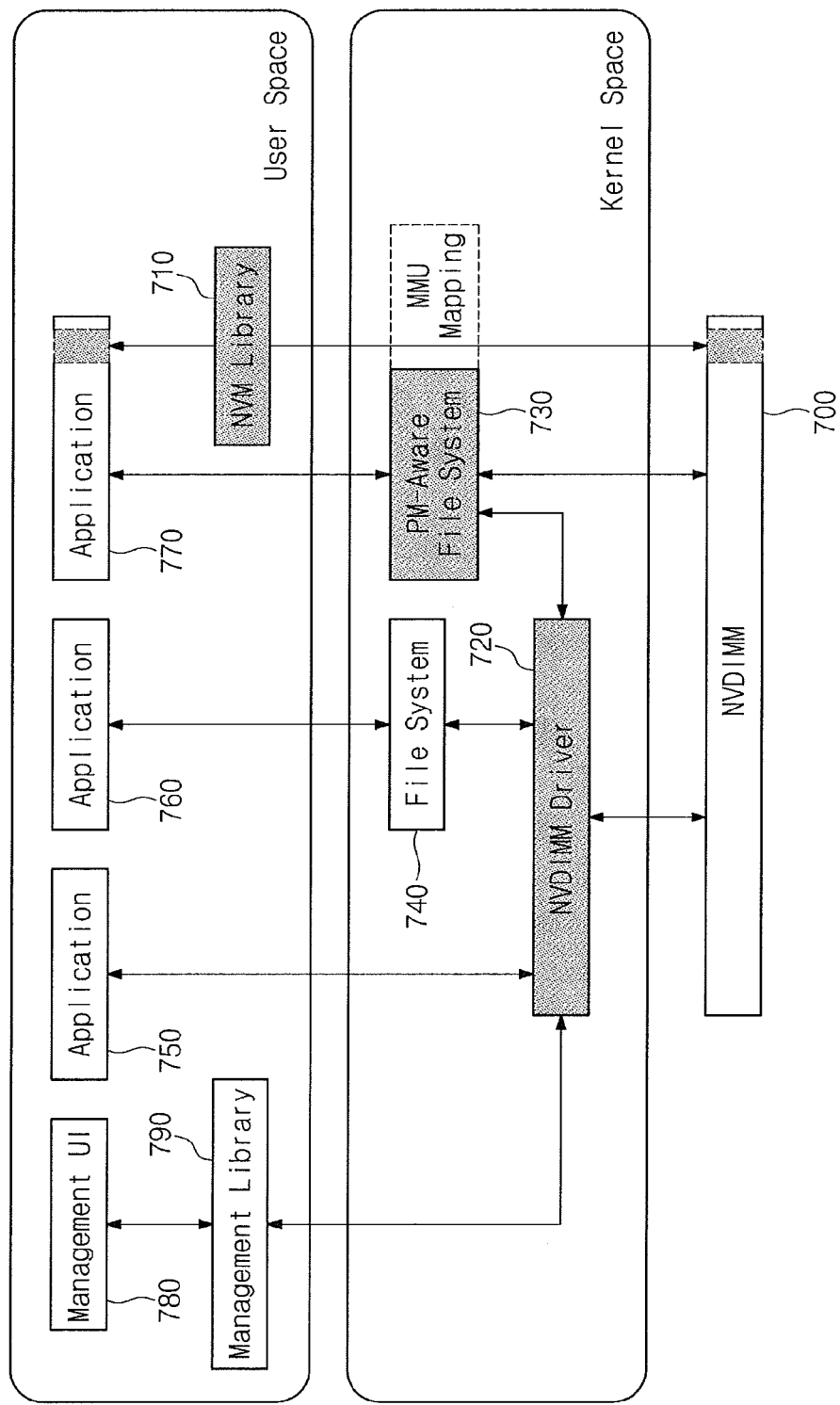
FIG. 14 is a block diagram illustrating software architecture of a processor, according to some embodiments of the inventive concepts.

FIG. 14 is a block diagram illustrating software architecture of a processor, according to some embodiments of the inventive concepts. Referring to FIG. 14, an application 770 may access a RAM of a nonvolatile memory module NVDIMM 700, for example, the nonvolatile memory modules NVDIMMs described herein, through a load/store interface which is accessible by using a nonvolatile memory library NVM Library 710. Furthermore, an application 770 and 760 through a nonvolatile memory module driver NVDIMM Driver 720 may access the nonvolatile memory module NVDIMM 700 by using a permanent memory (PM) aware file system PM-Aware File System 730 or a file system File System 740, respectively. Here, the nonvolatile memory module driver (NVDIMM driver) 720 may communicate with an application 750 through an application programming interface (API). Also, the application may directly access the nonvolatile memory module by using a raw device access interface without passing through the file system. Here, the raw device may be an area that is not set by the file system.

Meanwhile, a management user interface (UI) 780 may control the nonvolatile memory module driver by using a management library. The management library Management Library 790 may include instructions for managing memory allocation, cancellation, and the like on a main memory, or a system memory, of the memory module DIMM and/or the nonvolatile memory module NVDIMM. A kernel space includes the nonvolatile memory module driver 720, the file system 740 and the PM-Aware system 730. A user space includes applications 750, 760 and 770, nonvolatile memory library 710, management UI 780 and management library 790.

The computing system according to some embodiments of the inventive concepts may further include a nonvolatile memory that is according to a DDR-T (transaction) interface.

Figure 15:
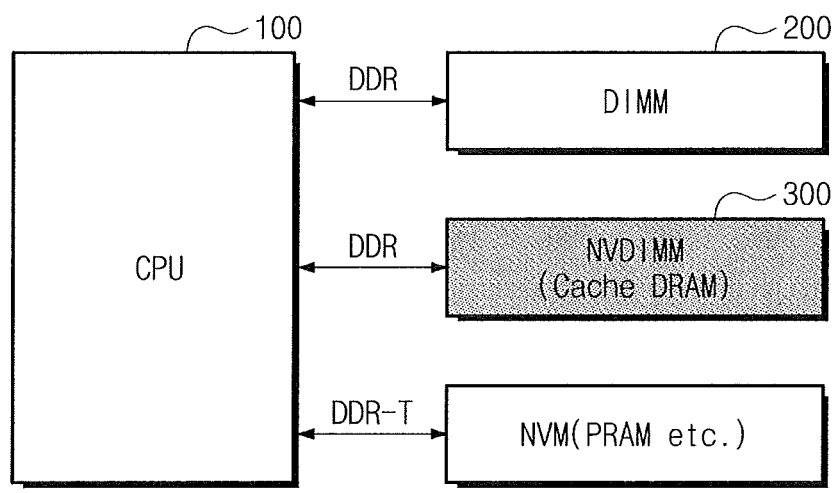
FIG. 15 is a diagram illustrating a computing system according to some embodiments of the inventive concepts.

FIG. 15 is a diagram illustrating a computing system 20 according to some embodiments of the inventive concepts. Referring to FIG. 15, the computing system 20 may include a processor 100, a memory module 200, a nonvolatile memory module NVDIMM 300 (cache DRAM), and a nonvolatile memory (NVM) 400, for example, a PRAM. Compared to the computing system 10 of FIG. 1, the computing system 20 may further include the nonvolatile memory 800 that inputs and outputs data according to the DDR-T interface. In such an embodiment, the memory module 200 may be implemented to perform a cache function of the nonvolatile memory 800. In some embodiments, the nonvolatile memory 800 may be a 3D-Xpoint memory.

The computing system 20 illustrated in FIG. 15 may use the memory module 200 as a cache of the nonvolatile memory 800; however, embodiments of the present inventive concepts are not limited thereto.

A computing system according to some embodiments of the inventive concepts may use a DRAM included in a processor as a cache of the nonvolatile memory 800.

Figure 16:
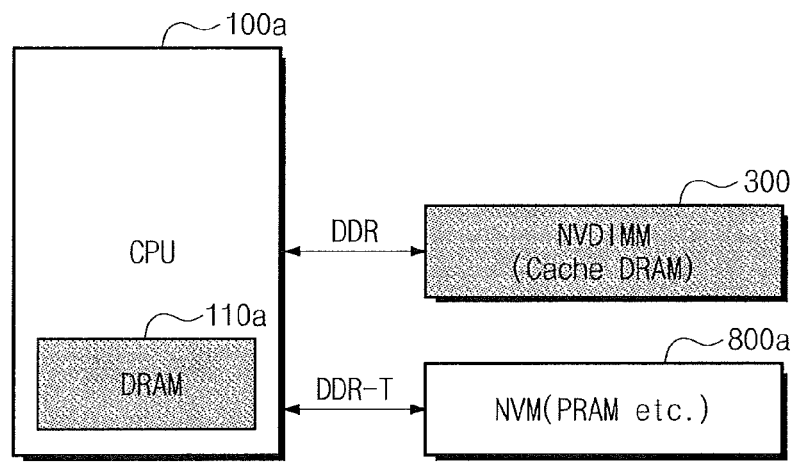
FIG. 16 is a diagram illustrating a computing system according to some embodiments of the inventive concepts.

FIG. 16 is a diagram illustrating a computing system 30 according to some embodiments of the inventive concepts. The computing system 30 includes a processor 100a, a nonvolatile memory module NVDIMM 300 (cache DRAM), and nonvolatile memory NVM 800a. A DRAM 110a is included in the processor 100a. Compared to the computing system 20 of FIG. 15, the computing system 30 of FIG. 16 may perform a cache function of a DIMM inside a DRAM 110a of a processor 100a.

A computing system according to some embodiments of the inventive concepts may include a processor that includes a DRAM performing a cache function of a nonvolatile memory module NVDIMM.

Figure 17:
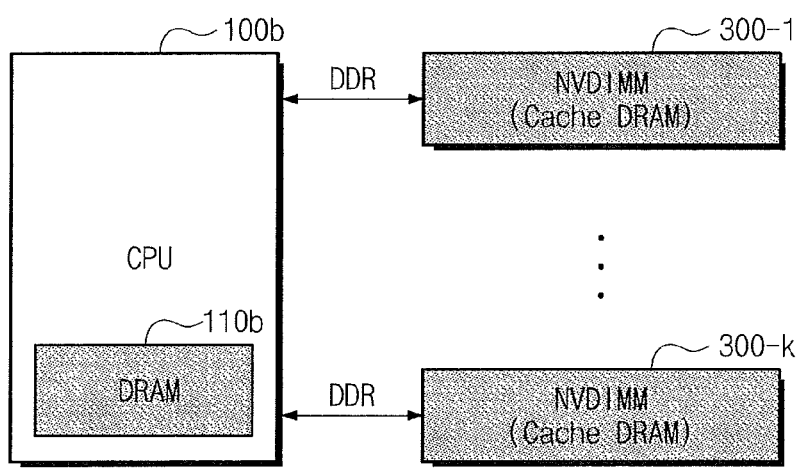
FIG. 17 is a diagram illustrating a computing system according to some embodiments of the inventive concepts.

FIG. 17 is a diagram illustrating a computing system 40 according to some embodiments of the inventive concepts. Referring to FIG. 17, the computing system 40 may include a host 100b including a DRAM 110b and nonvolatile memory modules NVDIMM (Cache DRAM) 300-1 to 300-k (k being an integer). The DRAM 110b may perform a cache function of the nonvolatile memory, modules 300-1 to 300-k. The host 100b may be connected to the nonvolatile memory modules 300-1 to 300K according to DDR interfaces.

A computing system according to some embodiments of the inventive concepts may be connected to various kinds of storage devices.

Figure 18:
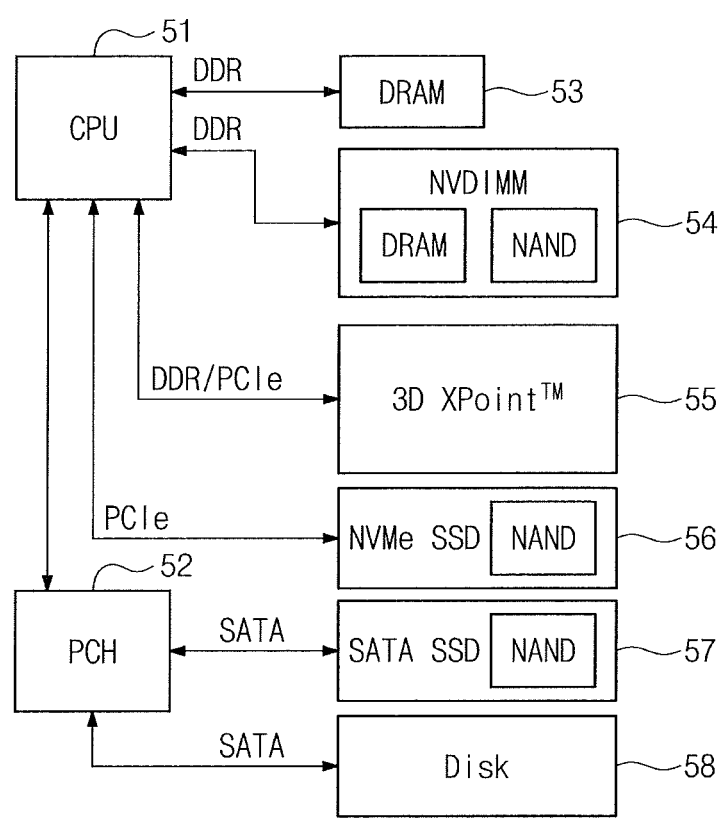
FIG. 18 is a diagram illustrating a computing system according to some embodiments of the inventive concepts.

FIG. 18 is a block diagram illustrating a computing system 50 according to some embodiments of the inventive concepts. Referring to FIG. 18, a computing system 50 may include a central processing unit (CPU) 51, a platform controller hub (PCH) 52, a DRAM 53, an nonvolatile memory module NVDIMM 54, a three-dimensional (3D) Xpoint™ memory 55, a NVM express (NVMe) solid state drive SSD 56, a Serial AT attachment (SATA) solid state drive SSD 57, and a disk 58.

The DRAM 53 and the NVDIMM 54 may communicate with the CPU 51 according to the DDR protocol. The 3D Xpoint memory 55 may communicate with the CPU 51 according to the DDR-T/PCIe protocol. The NVMe SSD 56 may communicate with the CPU 51 according to the PCIe protocol. The platform controller hub 52 may be connected with storage devices according to various interfaces. For example, the SATA SSD 57 may be connected to the platform controller hub 52 by using the SATA interface. The disk 58 may be connected to the platform controller hub 52 by using the SATA interface.

Figure 19:
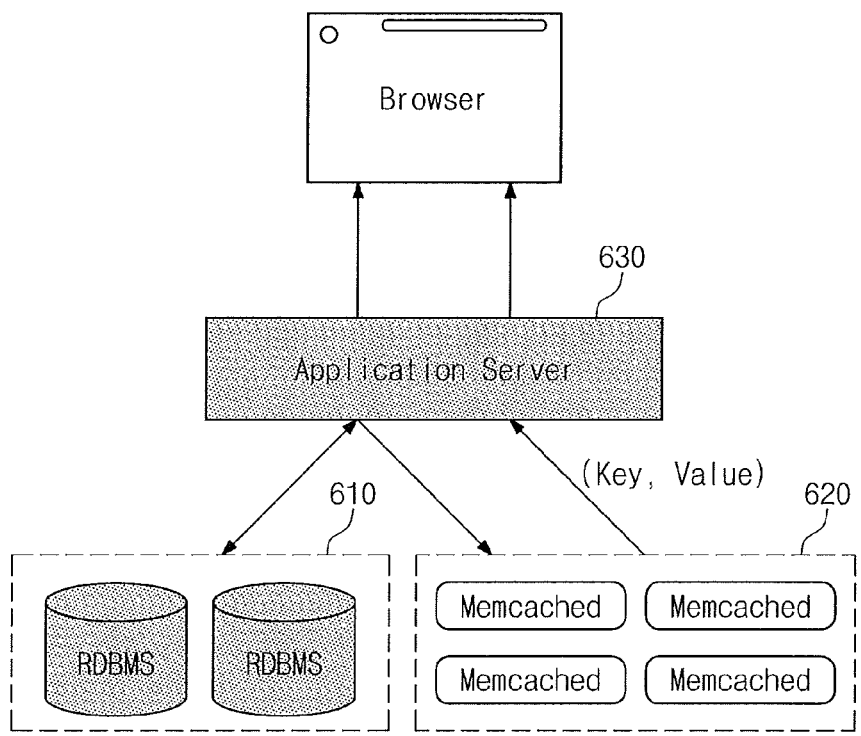
FIG. 19 is a block diagram illustrating a data server system according to some embodiments of the inventive concepts.

FIG. 19 is a block diagram illustrating a data server system 60 according to some embodiments of the inventive concepts. Referring to FIG. 19, the data server system 60 may include a related database management system (RDBMS) 610, a cache server 620, and an application server 630 and a browser.

The cache server 620 may maintain and delete a pair of key and value that are different from each other in compliance with a disable notification from the related database management system 610.

At least one of the RDBMS 610, the cache server 620, and the application server 630 may include at least one of the nonvolatile memory modules NVDIMM described with reference to FIGS. 1 to 18.

The nonvolatile memory module is described with reference to FIGS. 1 to 19; however, embodiments of the inventive concepts are not limited thereto. Some embodiments of the inventive concepts may be applicable to any kind of computing system that uses a DRAM as a cache of a nonvolatile memory.

Figure 20:
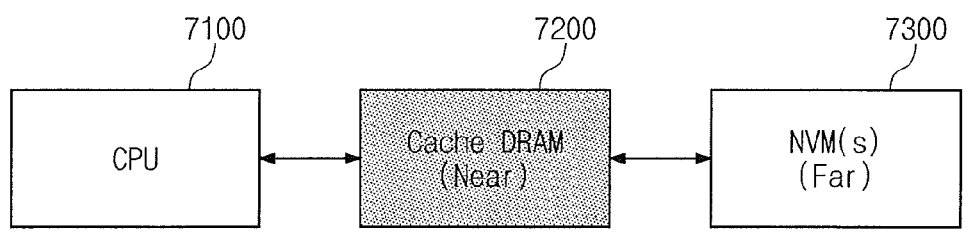
FIG. 20 is a diagram illustrating a computing system according to some embodiments of the inventive concepts.

FIG. 20 is a block diagram illustrating a computing system 70 according to some embodiments of the inventive concepts. Referring to FIG. 20, the computing system 70 may include a CPU 7100, a cache DRAM 7200, and at least one nonvolatile memory 7300. The cache DRAM 7200 may perform a cache function of the nonvolatile memory 7300. The cache DRAM 7200 may be referred to as a "near memory" because it is relatively close to the CPU 7100, and the nonvolatile memory 7300 may be referred to as a "far memory" because it is relatively distant from the CPU 7100.

According to some embodiments of the inventive concepts, a nonvolatile memory module and a computing system thereof may use a nonvolatile memory module having a cache DRAM as a working memory, thereby achieving a low cost, a high capacity, and high performance.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A nonvolatile memory module comprising:
    at least one nonvolatile memory;
    at least one nonvolatile memory controller configured to control the at least one nonvolatile memory;
    at least one dynamic random access memory (DRAM) used as a cache of the at least one nonvolatile memory;
    data buffers configured to store data exchanged between the at least one DRAM and an external device; and
    a memory module control device configured to control the nonvolatile memory controller, the at least one DRAM, and the data buffers,
    wherein the at least one DRAM stores a tag corresponding to cache data and compares the stored tag with input tag information to determine whether to output the cache data, and
    wherein the at least one DRAM comprises:
        at least one tag DRAM configured to store the stored tag; and
        at least one data DRAM configured to store the cache data,
        wherein the at least one tag DRAM comprises:
        a first memory cell array configured to store the tag;
        a first tag comparison circuit configured to compare the stored tag with the tag information to generate a match signal indicating a cache hit or cache miss; and
        a first multiplexer deactivated when the first tag comparison circuit is activated.

2. The nonvolatile memory module of claim 1, wherein the at least one tag DRAM and the at least one data DRAM are implemented differently from each other.

3. The nonvolatile memory module of claim 1, wherein the at least one tag DRAM and the at least one data DRAM are implemented the same as each other.

4. The nonvolatile memory module of claim 3,
    wherein the at least one data DRAM comprises:
        a second memory cell array configured to store cache data corresponding to the stored tag;
        a second tag comparison circuit; and
        a second multiplexer deactivated when the second tag comparison circuit is activated and configured to determine whether to output the cache data in response to the match signal.

5. The nonvolatile memory module of claim 4, wherein the first and second tag comparison circuits and the first and second multiplexers are activated or deactivated by a fuse cutting or mode register setting.

6. The nonvolatile memory module of claim 4, wherein the at least one tag DRAM and the at least one data DRAM each comprise at least one pin associated with the match signal.

7. The nonvolatile memory module of claim 1, wherein the at least one DRAM includes a dual port DRAM.

8. The nonvolatile memory module of claim 7, wherein the at least one DRAM comprises:
    first ports associated with an input/output path between the at least one DRAM and the data buffers; and
    second ports associated with an input/output path between the at least one DRAM and the at least one nonvolatile memory controller.

9. The nonvolatile memory module of claim 7, wherein the at least one DRAM comprises:
    a dedicated channel connected to the at least one nonvolatile memory controller to perform a flush function.

10. A nonvolatile memory module comprising:
    at least one first nonvolatile memory;
    at least one second nonvolatile memory;
    a first nonvolatile memory controller configured to control the at least one first nonvolatile memory;
    a second nonvolatile memory controller configured to control the at least one second nonvolatile memory;
    first DRAMs connected to the first nonvolatile memory controller;
    second DRAMs connected to the second nonvolatile memory controller;
    data buffers connected to the first and second DRAMs; and
    a memory module control device configured to generate a first command/address and a second command/address in response to a command/address from an external device, control the first and second nonvolatile memory controllers using the first command/address, and control the first and second DRAMs using the second command/address,
    wherein each of the first and second DRAMs stores a cache and determines whether a cache hit is generated with respect to the cache, and
    wherein each of the first and second DRAMs comprises:
        at least one tag DRAM configured to store a tag corresponding to the cache; and
        at least one data DRAM configured to store cache data,
        wherein the at least one tag DRAM comprises:
        a first memory cell array configured to store the tag;
        a first tag comparison circuit configured to compare the stored tag with input tag information to generate a match signal indicating a cache hit or cache miss; and
        a first multiplexer deactivated when the first tag comparison circuit is activated.

11. A nonvolatile memory module comprising:
    at least one nonvolatile memory;
    at least one nonvolatile memory controller configured to control the at least one nonvolatile memory;
    at least one dynamic random access memory (DRAM) used as a cache of the at least one nonvolatile memory; and
    a memory module control device configured to control the nonvolatile memory controller and the at least one DRAM and configured to output tag information to the at least one DRAM,
    wherein the at least one DRAM stores a tag corresponding to cache data and compares the stored tag with the tag information from the memory module control device to determine whether a hit/miss is generated with respect to the cache, through the tag comparison; and
    wherein the at least one DRAM comprises:
        a plurality of DRAMs that store both the tag and the cache data, wherein each of the plurality of DRAMs comprises:
a tag array configured to store the tag in first DRAM cells connected to a word line; and
a data array configured to store the cache data in second DRAM cells connected to the word line,
wherein the tag array stores tags corresponding to a plurality of caches according to a multi-way method,
wherein the data array stores cache data corresponding to the caches, and
wherein the tags and cache data corresponding to the caches are output by using a column to column delay time (tCCD).

12. The nonvolatile memory module of claim 11, further comprising data buffers configured to store data exchanged between the at least one DRAM and an external device and wherein the memory module control device is configured to control the data buffers.

13. The nonvolatile memory module of claim 12, wherein each of the plurality of DRAMs further comprises:
an address decoder configured to activate the word line in response to a row address;
a column decoder and sense amplifier configured to activate a first column selection line connected to the first DRAM cells and a second column selection line connected to the second DRAM cells in response to a column address and read the stored tag from the first DRAM cells or the cache data from the second DRAM cells;
a tag comparison circuit configured to compare the stored tag with the tag information from the memory module control device and generate a match signal indicating a cache hit or cache miss based on the comparison result; and
a multiplexer configured to output the cache data to one of the data buffers in response to the match signal.

14. The nonvolatile memory module of claim 13, wherein when a write request is received, a first match signal indicating the cache hit corresponding to the write request is generated by reading a first tag from the tag array and comparing the read tag with first tag information received with the first tag, and first cache data corresponding to the write request is stored in the data array in response to the first match signal.

15. The nonvolatile memory module of claim 13, wherein, when a read request is received, a second match signal indicating the cache hit corresponding to the read request is generated by reading a second tag from the tag array and comparing the read second tag with second tag information received with the second tag, and second cache data corresponding to the read request is read from the data array in response to the second match signal.

16. The nonvolatile memory module of claim 13, wherein the stored tag comprises a tag, cache data, and at least one parity for error correction of the tag.

17. The nonvolatile memory module of claim 13, wherein each of the tags further comprises dirty/clear information, and
wherein the dirty/clear information is output together with the cache data.

* * * * *